(12) United States Patent
Williams et al.

(10) Patent No.: US 8,308,047 B2
(45) Date of Patent: *Nov. 13, 2012

(54) COMPLIANT SPRAY FLUX MASKS, SYSTEMS, AND METHODS

(75) Inventors: Joel Williams, Chandler, AZ (US);
Sonny J. Randall, Maricopa, AZ (US);
Steven B. Roach, Chandler, AZ (US);
Sabina J. Houle, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 1368 days.

This patent is subject to a terminal disclaimer.

(21) Appl. No.: 11/612,652

(22) Filed: Dec. 19, 2006

(65) Prior Publication Data

US 2008/0145541 A1   Jun. 19, 2008

(51) Int. Cl.
*B23K 1/20* (2006.01)
*B05C 5/02* (2006.01)
*B05C 17/06* (2006.01)

(52) U.S. Cl. .............. 228/33; 228/39; 228/41; 118/504; 118/505; 118/301

(58) Field of Classification Search .................. 118/504, 118/505, 301; 228/33, 39, 41; 427/282
See application file for complete search history.

(56) References Cited

U.S. PATENT DOCUMENTS

| | | | |
|---|---|---|---|
| 3,647,533 A * | 3/1972 | Hicks | 427/96.8 |
| 4,893,403 A | 1/1990 | Heflinger et al. | |
| 6,316,289 B1 * | 11/2001 | Chung | 438/118 |
| 7,208,046 B1 * | 4/2007 | Anderson et al. | 118/320 |
| 2008/0145540 A1 | 6/2008 | Houle et al. | |

OTHER PUBLICATIONS

"Definition of "rail" from Merriam-Webster's Online Dictionary", cited in U.S. Appl. No. 11/612,642, filed Feb. 9, 2009 Office Action, 2 pgs.
"U.S. Appl. No. 11/612,642, Final Office Action mailed Aug. 3, 2009", 7 pgs.
"U.S. Appl. No. 11/612,642, Notice of Allowance mailed Sep. 21, 2009", 12 Pgs.
"U.S. Appl. No. 11/612,642, Response filed Jun. 9, 2009 to Non Final Office Action mailed Feb. 9, 2009", 12 pgs.
"U.S. Appl. No. 11/612,642, Response filed Aug. 25, 2009 to Final Office Action mailed Aug. 3, 2009", 12 pgs.

* cited by examiner

*Primary Examiner* — Laura Edwards
(74) *Attorney, Agent, or Firm* — Schwegman, Lundberg & Woessner, P.A.

(57) ABSTRACT

A flux spray head, a mask, and an integrated circuit substrate are arranged in a flux spray station to reduce flux overspray during a spraying operation. A support element within the spray station is used to align the substrate with the mask and spray head. A portion of the mask contacts the substrate along a boundary between a region to be sprayed and a region to be masked. The flux spray head sprays the substrate while a portion of the mask is in contact with the boundary of the region to be masked. In an embodiment, the mask may comprise one or more replaceable non-stick stencil elements and associated springs to press the stencil elements against the substrate. Each stencil element may have a wall to contact the substrate along a portion of the boundary.

22 Claims, 6 Drawing Sheets

COMPLIANT SPRAY FLUX MASKS, SYSTEMS, AND METHODS

TECHNICAL FIELD

The subject matter relates generally to electronics packaging and, more particularly, to flux overspray control during electronics packaging assembly, and to manufacturing methods related thereto.

BACKGROUND INFORMATION

One or more integrated circuits ("IC") dice may be assembled into an IC package by physically and electrically coupling them to a substrate made of organic or ceramic material. One or more IC packages may be physically and electrically coupled to a printed circuit board ("PCB") to form an "electronic assembly". The "electronic assembly" may be part of an "electronic system". An "electronic system" is broadly defined herein as any product comprising an "electronic assembly". Examples of electronic systems include computers (e.g., server, router, desktop, laptop, hand-held, Web appliance, etc.), wireless communications devices (e.g., cellular phone, cordless phone, pager, etc.), computer-related peripherals (e.g., printer, scanner, monitor, etc.), entertainment devices (e.g., television, radio, stereo, tape and compact disc players, video cassette recorder, camcorder, game device, digital camera, MP3 (Motion Picture Experts Group, Audio Layer 3) player, etc.), and the like.

In the field of electronics there is competitive pressure among manufacturers to drive the performance of their equipment up while driving production costs down and maintaining acceptable yield and reliability. This is especially true for packaging of dice on substrates, where problems with flux overspray may reduce yield and/or increase throughput time.

One of the conventional methods for mounting an IC on a substrate is called "controlled collapse chip connect" (C4). In fabricating a C4 package, the electrically conductive terminations or lands (generally referred to as "electrical contacts") of an IC component are soldered directly to corresponding lands on the surface of the substrate using reflowable solder bumps or balls. The C4 process is widely used because of its robustness and simplicity. In a known C4 process, a plurality of solder bumps or balls may be arranged in a pattern upon the substrate where an IC is to be mounted.

Flux may subsequently be deposited on the C4 bump region to help maintain the die or dice in place and to remove metal oxides that may otherwise prevent high quality metal bonding. One fluxing goal is to apply an even amount of flux to the bump field and to restrict the flux presence in other areas, such as areas outside the die-bonding area. These keep-out areas may include areas containing die-side lands, which lands may be used to mount additional components around the die or dice. Die-side lands may have been coated with solder, such as solder paste, prior to an application of flux spray. If excess flux extends onto die-side lands, the solder paste may be contaminated. This may lead to reduced yield and increased processing time.

DETAILED DESCRIPTION

In the following detailed description of embodiments of the subject matter, reference is made to the accompanying drawings, which form a part hereof, and in which is shown by way of illustration specific preferred embodiments in which the subject matter may be practiced. These embodiments are described in sufficient detail to enable those skilled in the art to practice the subject matter, and it is to be understood that other embodiments may be utilized and that structural, mechanical, compositional, electrical, and procedural changes may be made without departing from the spirit and scope of the subject matter. The following detailed description is, therefore, not to be taken in a limiting sense, and the scope of the subject matter is defined only by the appended claims.

The following description includes terms, such as upper, lower, front, rear, first, second, etc. that are used for descriptive purposes only and are not to be construed as limiting. The embodiments of an apparatus or article described herein can be manufactured, used, or shipped in a number of positions and orientations.

Reference will now be made to the drawings. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

During assembly of an IC package, flux overspray may extend onto the lands for the die-side components. This may cause the solder for the die-side components to not flow as intended, and electrical shorts may occur between the die-side lands. Additionally, flux overspray may cause contamination of the solder paste, causing unpredictable results during the reflow operation. Such problems may lead to reduced yield and higher processing time, and therefore higher production costs.

The inventive subject matter provides a solution to certain spray flux application problems that may be associated with packaging of IC's. In an embodiment, a flux spray head, a mask, and an integrated circuit substrate are arranged in a flux spray station to reduce flux overspray during the spraying operation. A support element within the spray station is used to align the substrate with the mask and spray head. A portion of the mask contacts the substrate along a boundary between a region to be sprayed and a region to be masked. A flux sprayer sprays the substrate while a portion of the mask is in contact with the boundary of the region to be masked. In an embodiment, the mask may comprise one or more replaceable non-stick stencil elements and associated springs to press each stencil element individually against the substrate. Each stencil element may have a wall to contact the substrate at a portion of the boundary of the region to be sprayed. Various embodiments are illustrated and described herein.

"Suitable", as used herein, means having characteristics that are sufficient to produce the desired result(s). Suitability for the intended purpose can be determined by one of ordinary skill in the art using only routine experimentation.

Figure 1:
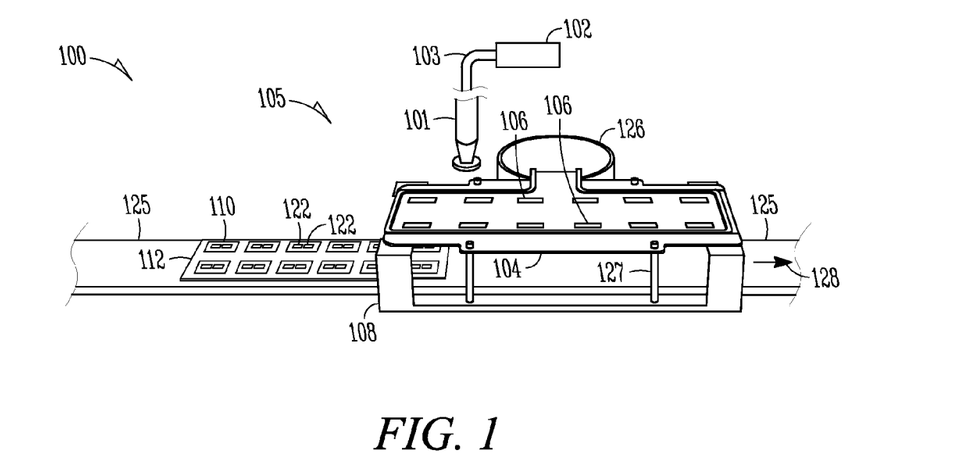
FIG. 1 illustrates a perspective representation of a substrate carrier approaching a spray station of a spraying system, in accordance with an embodiment of the subject matter.
Figure 2:
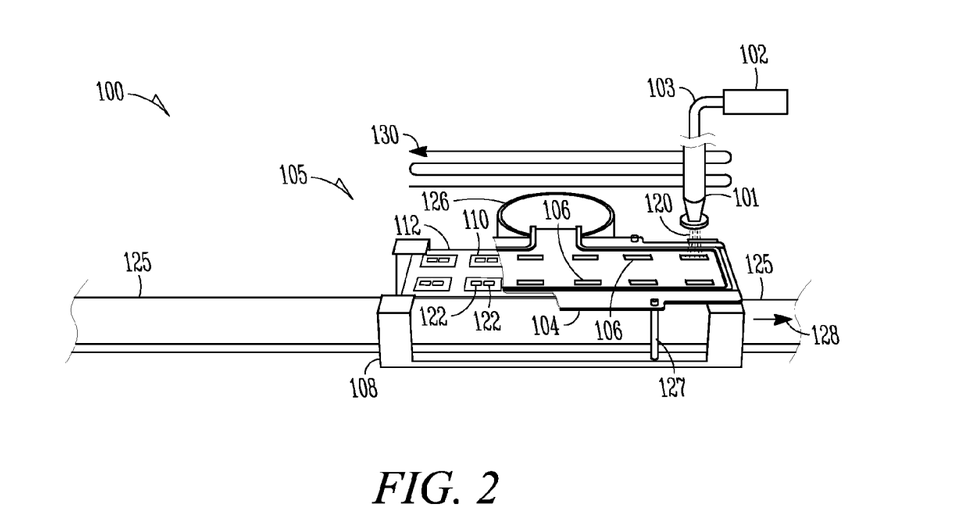
FIG. 2 illustrates a perspective representation of a substrate carrier being sprayed in a spray station of a spraying system, in accordance with an embodiment of the subject matter.

FIGS. 1 and 2 illustrate a perspective representation of a substrate carrier 112 approaching and being sprayed in a spray station 105 of a spraying system 100, in accordance with an embodiment of the subject matter. The spraying system 100 includes a transport element, such as a belt 125, to move at least one carrier 112 in direction 128 into and out of spray station 105. Carrier 112 is shown as having a plurality of substrates 110 in a pattern. In the example illustrated, each substrate 110 includes a pair of die-bonding areas 122; however, it will be understood that many other arrangements of substrates 110 may be used.

The spray station 105 may include a flux spray head 101 that receives spray flux from a flux reservoir 102 via a spray tube 103, a mask 104 having a plurality of apertures 106, a frame 108, and bolts 127 to support the mask 104. The spraying system 100 allows for a spraying medium, such as a spray flux 120 (shown in FIG. 2), to be sprayed along a spray path 130 (shown in FIG. 2) that corresponds to the plurality of apertures 106 within the mask 104.

In an embodiment, the apertures 106 in the mask 104 correspond to the locations of die-bonding areas 122 on the substrates 110 to be sprayed. In an embodiment, a portion of the mask 104 contacts the substrates 110 at a boundary between a region to be sprayed and a region to be masked (shown in FIG. 6). In an embodiment, the mask 104 may comprise a wall (refer to FIGS. 7 and 8) to contact the substrate 112 at a portion of a boundary separating a region to be sprayed from a region to be masked.

The apertures 106 are disposed within the mask 104 such that they form a pattern thereon. The apertures 106 in the mask 104 correspond to the position of unmasked areas (refer to FIG. 7) on the substrate 110. In an embodiment, the mask 104 may be supported within the spraying system 100 by the frame 108. In FIG. 1, the mask 104 has already been affixed to the rail (refer to FIG. 3) on the frame 108 using suitable connectors, such as screws (not shown) or bolts 127. In other embodiments, the mask 104 may be affixed to the frame 108 in any suitable manner known in the art. In an alternative embodiment, the rail itself may support the mask 104 within the spraying system 100. In an embodiment, the mask 104 may comprise a plurality of stencil elements, each having at least one aperture 106 (shown in FIG. 3).

In operating the spraying system 100, a belt 125 moves the carrier 112 in direction 128 until the substrates 110 contained in the carrier 112 are in alignment with apertures 106 in the mask 104. The frame 108 then lifts the carrier 112 containing the substrates 110 into contact with the lower surface of mask 104 as shown in FIG. 2. Any suitable mechanism known in the art may be used to raise and lower the carrier 112, such as any type of pneumatic, hydraulic, magnetic, and/or electro-mechanical lifter. In an embodiment, the apertures 106 in the mask 104 are thus aligned with pairs of the die-bonding areas 122 on the substrate 110 (see FIG. 7).

While held in this position, the flux spray head 102 passes over the mask 104 in any suitable pattern, spraying a measured amount of spray flux 120 onto the mask 104 and through the apertures 106 overlying the substrates 110. In an embodiment, the flux spray head may follow pattern 130, as shown in FIG. 2. After the flux 120 has been sprayed, the carrier 112 holding the substrates 110 is lowered back down to the belt 128 and resumes travel in direction 128 for further processing. In an embodiment, excess spray flux 120 remaining on the top surface of the mask 104 may flow into a drain 126 for collection.

The substrates 110 may be made of any suitable material. In an embodiment, substrates 110 may comprise organic or ceramic compounds. However, it is expected that embodiments could also include substrates comprising other materials. Furthermore, the unmasked areas are not limited to die-bonding areas or substrates associated with an IC package. In an alternative embodiment, a substrate may be a printed circuit board, printed wire assembly, or the like. Any suitable number of substrates 110 may be located on an individual carrier 112. In an embodiment, one or more substrates 110 may be located on the carrier 112. In another embodiment, at least two substrates 110 and up to twelve substrates 110 may be located on the carrier 112. In yet another embodiment, more than twelve substrates 110, such as up to 126 substrates 110, may be located on the carrier 112. In other embodiments, more than 126 substrates 110 may be located on the carrier 112. In an embodiment, the number of apertures 106 in the mask 104 coincides with the number of substrates 110 disposed upon the carrier 112.

Any suitable spray flux 120 known in the art can be used in the flux spraying system 100. In most embodiments, the spray flux 120 has sufficient chemical activity at elevated temperatures to remove metal oxide, such as on solder bumps, to ensure that proper bonding takes place during reflow. In most embodiments, the spray flux 120 can be processed at elevated temperatures in subsequent manufacturing steps, such as up to about 240° C. In most embodiments, the spray flux 120 is cleanable, such that any residual spray flux 120 may be removable with water, so that epoxy added in the next processing step may have proper flow or capillary action throughout the bump areas.

In an embodiment, the spray flux 120 may have a viscosity such that it may be sprayed at room temperature. In another embodiment, the spray flux 120 may be sprayed at a temperature between approximately 30° C. and 60° C. In a particular embodiment, the spray flux 120 may be sprayed at a temperature of about 45° C. In an alternative embodiment, the spray flux 120 may have a relatively higher viscosity and may be sprayed at correspondingly higher temperatures. In an embodiment the spray flux 120 has a viscosity of between about two (2.0) pascal seconds and about 0.1 pascal seconds at ambient or room temperature. In an embodiment, spray flux from Kester, a company now wholly owned by Illinois Tool Works, Inc., having offices in Glenview, Ill. may be used.

In an alternative embodiment, the media to be sprayed on the substrate 110 may comprise any suitable low viscosity material in lieu of spray flux 120.

Figure 3:
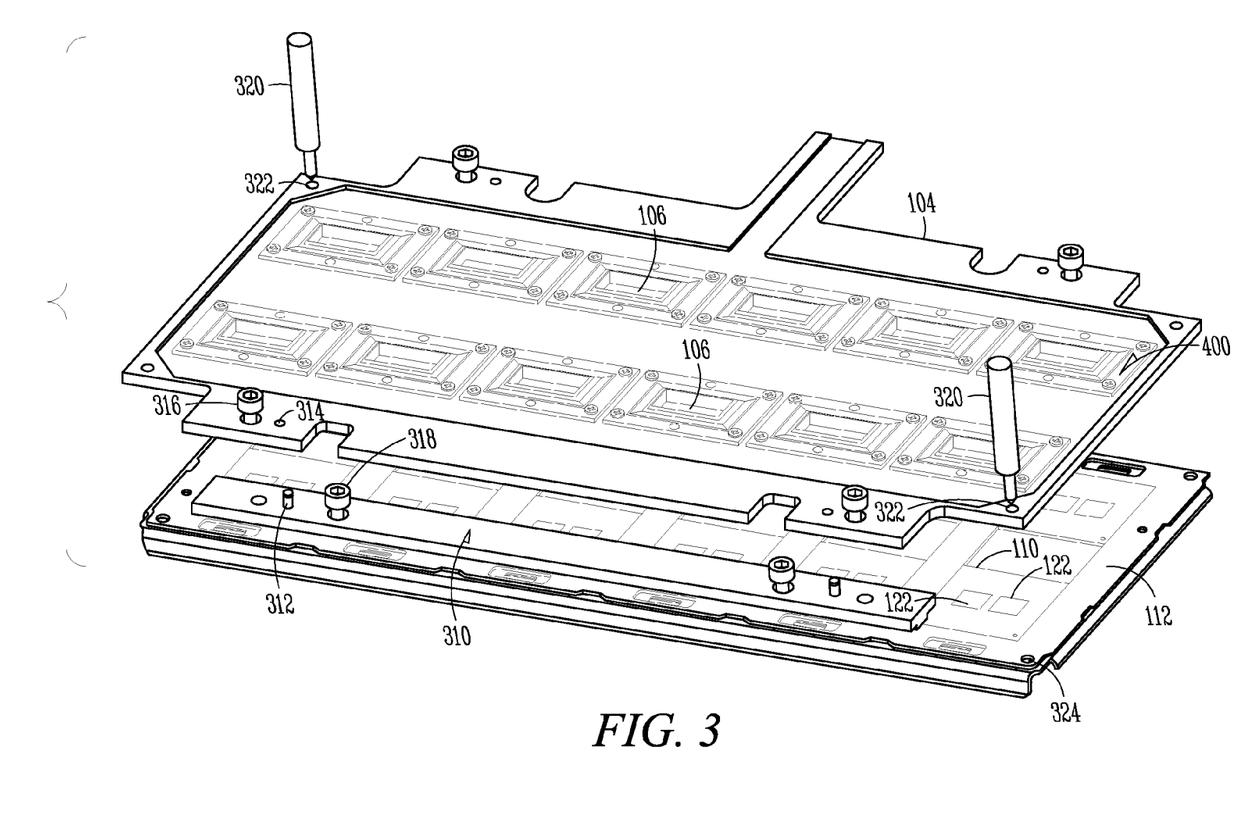
FIG. 3 illustrates an exploded view of a substrate carrier, a mounting rail, and a mask, in accordance with an embodiment of the subject matter.

FIG. 3 illustrates an exploded view of a substrate carrier 112, a mounting rail 310, and a mask 104, in accordance with an embodiment of the subject matter. The substrate carrier 112 holds one or more substrates 110. Each substrate 110 may have one or more die-bonding areas 122. Mask 104 may be aligned with substrate carrier 112 by using alignment pegs 320 in alignment holes 322 and 324. In an embodiment, a plurality of apertures 106 in mask 104 correspond with pairs of the die-bonding areas 122 on substrates 110. In an embodiment, apertures 106 may be part of a stencil assembly 400, described in FIG. 4.

Rail 310 may be affixed to the spray station frame 108 (shown in FIGS. 1 and 2) by screws 318. Rail 310 may include an alignment pin 312 to facilitate accurate alignment of alternate types of mask 104, as used in other embodiments. Mask 104 may have a corresponding alignment point 314. Additionally, in some embodiments, more than one rail 310 may be used, for example one rail 310 may be positioned along each edge of mask 104. In an embodiment, mask 104 may be affixed to rail 310 by screws 316.

In an embodiment, substrate carrier 112 may comprise a plurality of recessed regions, into each of which a substrate 110 may be placed. The substrate 110 may be affixed to substrate carrier 112 in any suitable manner. In an embodiment, the substrate may be affixed to the substrate carrier 112 by a spring clip.

During the flux-spraying operation, substrate carrier 112 may be positioned beneath mask 104, such that mask 104 is arranged between carrier 112 and the flux spray head. In an embodiment, carrier 112 may be aligned using alignment pins 312 and alignment points 314 to verify that the carrier 112 is accurately positioned beneath the mask 104. In an alternative embodiment, the carrier 112 is aligned using a suitable electronic measurement device.

In an embodiment, apertures 106 in mask 104 may comprise removable stencil elements 400. In an alternative embodiment, apertures 106 in mask 104 may be formed as integral parts of the mask 104, and they need not be removable. In such an embodiment, mask 104 may comprise any suitably durable non-stick material. In an embodiment, carrier 112 may be aligned with mask 104 such that apertures 106 in mask 104 are aligned with the pairs of die-bonding areas 122 on the substrates to be sprayed 110. In other embodiments, the apertures in mask 106 may be aligned over any suitable region of the substrate 110.

Figure 4:
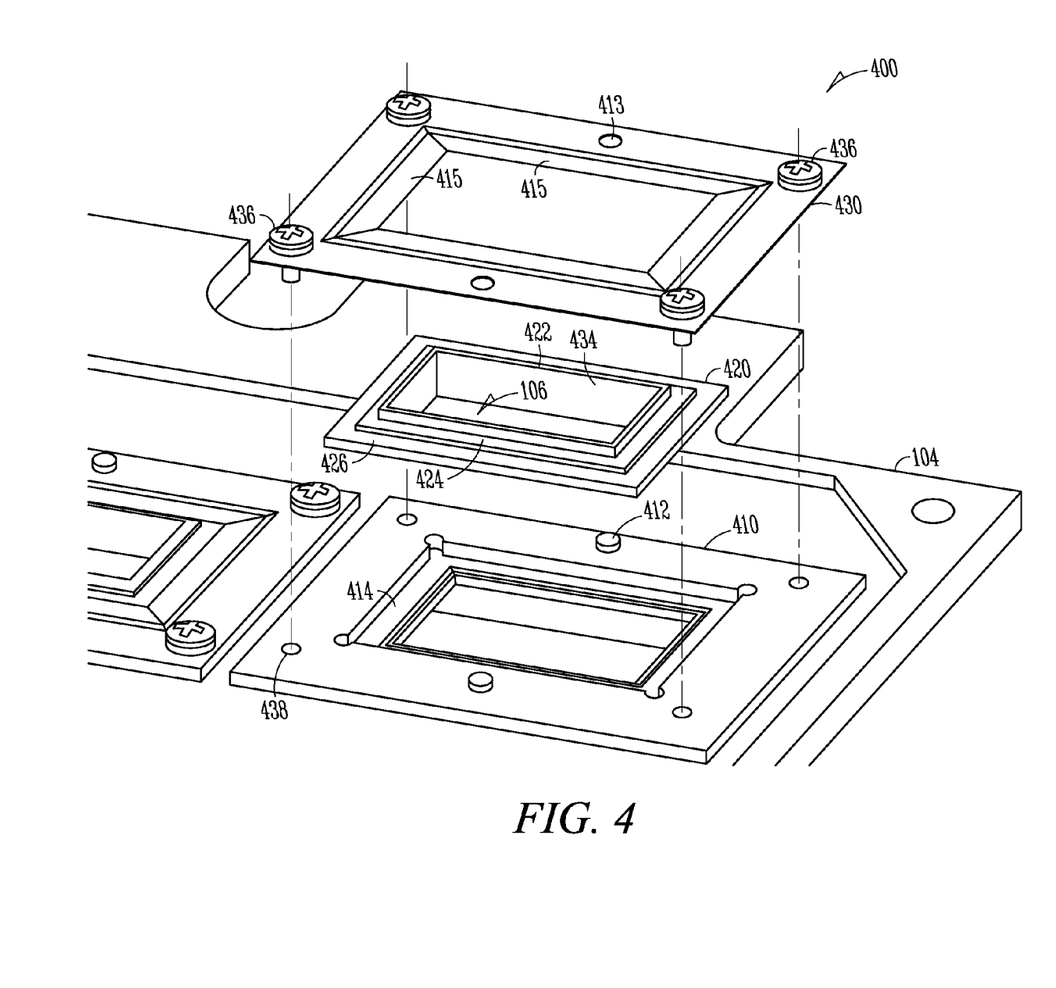
FIG. 4 illustrates a detail view of a stencil assembly, including a mask, a stencil element, and a spring, in accordance with an embodiment of the subject matter.

FIG. 4 illustrates a detail view of a stencil assembly 400, including a mask 104, a stencil element 420, and a spring 430, in accordance with an embodiment of the subject matter. Mask 104 may have a stencil mount 410, including a recess 414 to hold the stencil element 420, one or more alignment bumps 412, and a screw hole 438. Stencil element 420 may include a wall 422 that extends downward through and beyond the lower surface of mask 104 to contact the substrate 110, when the substrate 110 is in a raised position (refer to FIG. 2). Stencil element 420 may also include an aperture 106, and structural terraces or portions 424 and 426. Stencil element 420 may be pressed firmly into recess 414 by a spring 430. Spring 430 is secured by screws 436 to screw holes 438 after one or more alignment holes 413 are mated to alignment bumps 412.

In an embodiment, the stencil element 420 may comprise any suitable non-stick, acid-resistant material, such as, but not limited to, nylon, urethane, or a thermoplastic elastomer (TPE). In an embodiment, stencil elements 420 may comprise material such as polytetrafluoroethylene (PTFE), fluorinated ethylene-propylene (FEP), and perfluoroalkoxy polymer resin (PFA), such as, but not limited to, those commercially available under the Teflon trademark. In an embodiment, stencil elements 420 may comprise a compliant silicone elastomer, such as, but not limited to, those commercially available under the Silastic trademark. In an embodiment, stencil elements 420 may comprise a suitably plated or coated metal, plastic, or nylon.

In an embodiment, stencil elements 420 may comprise stainless steel, either coated or uncoated. In an embodiment, stencil elements 420 may comprise a theromoplastic polymer, such as polypropylene. In embodiment, polypropylene or nylon material may comprise glass. Adding a suitable coating to the stencil element material may provide resistance to acid in the spray flux. In an embodiment, the spring element 430 may comprise any suitable wear-resistant, acid-resistant material, such as, but not limited to tempered spring steel of suitable thickness and rigidity. In an embodiment, commercially available high carbon 1095 steel may be used.

Figure 5:
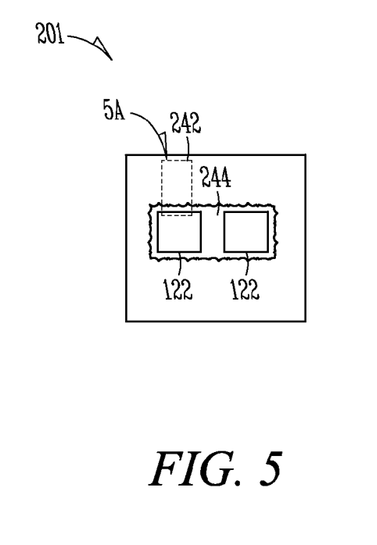
FIG. 5 illustrates a top view of two die-bonding areas on a substrate after flux has been sprayed, in accordance with an embodiment of the subject matter.

FIG. 5 illustrates a top view of two die-bonding areas 122 on a substrate 109 after flux 244 has been sprayed, in accordance with an embodiment of the subject matter.

Figure 5A:
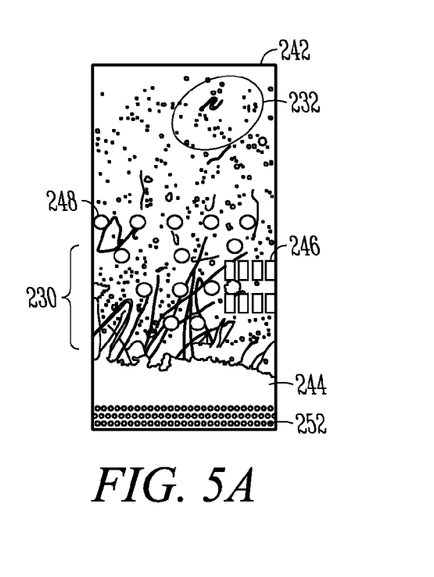
FIG. 5A illustrates an enlarged detail view of a region on the substrate shown in FIG. 5.

FIG. 5A illustrates an enlarged detail view of region 242 on the substrate 109 shown in FIG. 5. In the illustrated embodiment, region 242 is a region of the substrate 109 where no stencil element having a wall to contact the substrate 109 is used during the flux spraying operation, or where the stencil element used during the flux spraying operation is missing the rear wall segment, as in stencil element 440 shown in FIG. 8, described further below.

The substrate 109 shown in FIGS. 5 and 5A will now be described in more detail. In the illustrated embodiment, the unmasked area includes two die-bonding areas 122, a portion of substrate 109 located therebetween, and a flux region 244 surrounding and covering the two die-bonding areas 122. In an embodiment, a wall 444 of stencil element 440 (FIG. 8) may contact its respective substrate 109 along at least a portion of a boundary between an area to be sprayed and an area to be masked. In the embodiment illustrated in FIGS. 5 and 5A, the stencil element 440 used during the flux spray operation has a wall 444 with fewer than four segments because the back side is missing (see FIG. 8).

Therefore, in the embodiment shown in FIG. 5, the portion of the boundary where the wall 444 of stencil element 440 made contact with the substrate 109 during the flux spray operation did not include the portion of the boundary lying within region 242, because in region 242 flux spray extends virtually throughout the entire region.

In an embodiment using a stencil element 440 having only a partial wall 444, the stencil element 440 would be arranged so that the missing wall segment is aligned with a region of the substrate 109 that does not require a precisely controlled application of flux, and it will be understood that in such an embodiment component bonding pads 246 and 248 seen in FIG. 5A may not be present. In an embodiment, it may be desirable to omit a wall segment of stencil element 440 for a number of reasons. For example, by reducing the number of wall segments in a stencil element to the minimum number required for precise spray flux application, the cost of materials required to produce the stencil elements may be significantly reduced in a high-volume manufacturing environment.

Figure 6:
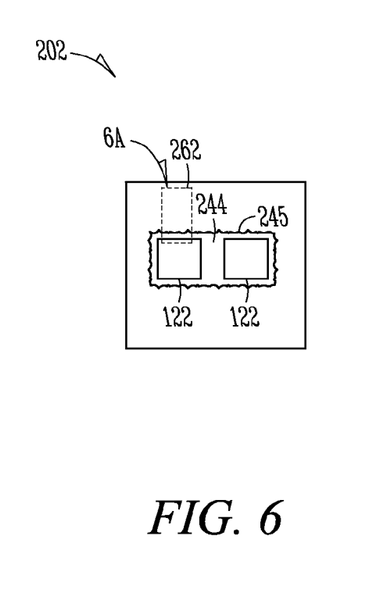
FIG. 6 illustrates a top view of the two die-bonding areas on a substrate after flux has been sprayed, in accordance with an embodiment of the subject matter.
Figure 6A:
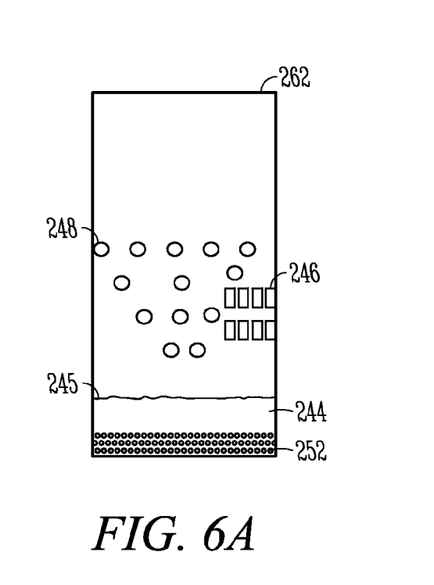
FIG. 6A illustrates an enlarged detail view of a region on the substrate shown in FIG. 6.

In FIG. 5A, component bonding pads 246 and 248 are shown merely to assist the reader in understanding that the scale of the substrate shown in FIG. 5 (and the enlarged detail view shown in FIG. 5A) is identical to the scale of the substrate shown in FIG. 6 (and the enlarged detail view shown in FIG. 6A). In the embodiment shown in FIG. 5A, a region 230 of dense overspray coincides with the position of the missing wall segment of stencil element 440 (shown in FIG. 8) during the flux spraying operation. Region 230 of dense overspray is relatively close to the spray source. In the illustrated embodiment, a region of light overspray 232 may also be seen, and it is assumed to be further away from the spray source.

In the embodiment shown in FIG. 5A, the die-bonding areas 122 may have solder balls 252 located thereon.

FIG. 6 illustrates a top view of the two die-bonding areas 122 on a substrate 110 after flux 244 has been sprayed, in accordance with an embodiment of the subject matter.

FIG. 6A illustrates an enlarged detail view of region 262 on the substrate 110 shown in FIG. 6.

The unmasked area of a representative substrate 110 is shown in detail in FIGS. 6 and 6A. In the illustrated embodiment, each unmasked area includes two die-bonding areas 122, a portion of substrate 110 located therebetween, and a flux region 244 surrounding and covering the two die-bonding areas 122. The die-bonding areas 122 may have solder balls 252 located thereon. The unmasked area, i.e., region to be sprayed, and masked area, i.e., no-spray region, may be separated by a spray flux boundary 245 as shown in FIGS. 6 and 6A. In an embodiment, the spray flux boundary 245 may be slightly irregular, within a given acceptable tolerance.

As shown in FIGS. 6 and 6A, the spray flux boundary 245 is in close proximity to the perimeter of the die-bonding areas 122, so as not to interfere with components or structures already present on the substrate 110 and away from the die-bonding areas 122, outward towards the periphery of substrate 109, such as those structures located within substrate region 262. In an embodiment, such structures may include component bonding pads 246 and 248 as shown in FIG. 6A, or other components to be added to the substrate 110 after the flux spraying operation. In an embodiment, a stencil element 420 of mask 104 contacts its respective substrate 110 along at least a portion of the boundary 245 (shown in FIG. 7). In an embodiment, a portion of each mask 104 contacts its respective substrate 110 along all or substantially all of the boundary 245.

In the embodiment shown in FIG. 6A, a portion of the mask 104, namely the lower edge of wall 434 of a stencil element 420 (FIG. 7) was in contact with the substrate 110 along the entire boundary 245 during the flux spraying operation. As a result, as seen in FIG. 6A, flux overspray has been prevented from extending beyond the boundary 245. In an embodiment where it is desired to prevent flux overspray from reaching certain regions of the substrate, such as component bonding pads 246 and 248, the wall 434 of stencil element 420 may comprise wall segments that completely enclose the region to be sprayed, as shown in FIG. 7.

In other embodiments, the masked areas may include any surface to be protected from spray. In an alternative embodiment, a surface other than an IC substrate may be sprayed. Additionally, the unmasked areas may include any region of the surface to be sprayed, including a region having fewer or more than two die-bonding areas 122.

Figure 7:
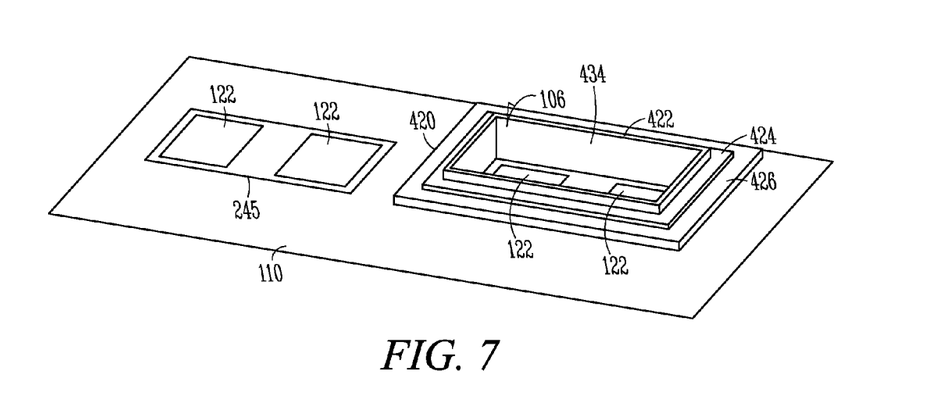
FIG. 7 illustrates a perspective representation of a stencil element overlying a pair of die-bonding areas of a substrate, in accordance with an embodiment of the subject matter.

FIG. 7 illustrates a perspective representation of a stencil element 420 overlying a first pair of die-bonding areas 122 of a substrate 110, in accordance with an embodiment of the subject matter. In the example illustrated, substrate 110 may comprise two pairs of die-bonding areas 122. The left-hand pair of die-bonding areas 122 is unmasked, whereas the right-hand pair of die-bonding areas 122 is covered by a stencil element 420. Each pair of die-bonding areas 122 is surrounded by a flux spray boundary 245 (not visible regarding the right-hand pair of die-bonding areas 122). Boundary 245 is between a region of substrate 110 to be sprayed with flux spray and a region to be masked from flux spray. In the example illustrated, flux spray is desired over both die-bonding areas 122, and flux spray onto the region between the die-bonding areas 122 is acceptable. In another embodiment, the stencil element 420 may be constructed to overlie individual die-bonding regions 122, thus masking substantially all of the region between the die-bonding areas 122.

Stencil element 420 has an aperture 106 to permit flux spray to contact the masked die-bonding areas 122. Stencil element 420 may comprise a frame of any suitable geometry that corresponds to the area to be masked on the substrate 110. In this example, die-bonding areas 122 are rectangular, and accordingly stencil element 420 is rectangular, as is aperture 106. In alternative embodiments, the geometry of stencil element 420 may have from 1 to N sides, where N is a positive integer.

Stencil element 420, in the embodiment illustrated, may comprise a box-like interior portion 422, open at the top and bottom, and comprising a wall 434. Wall 434 may protrude from the bottom side of the stencil element 420. Stencil element 420 may further comprise portions 424 and 426, as illustrated in FIG. 4.

In operation, substrate 110 and stencil element 420 are brought together, for example, by raising substrate 110 until the bottom of the wall 434 of the stencil element 420 is in contact with the boundary 245 of the substrate 110. In an embodiment, the wall 434 of the stencil element comprises four segments, each of which contacts a respective portion of the boundary 245 around the pair of die-bonding areas 122. In this example, the entire boundary 245 is contacted by the wall 434 of the stencil element 420. In other embodiments, in which wall 434 may have one or more segments missing, the wall 434 may contact the boundary 245 along less than 25%, 50%, and 75%, respectively, of the boundary 245. While the substrate 110 and stencil element 420 are pressed together, flux spray is applied in any suitable manner, e.g. by spraying through aperture 106, onto the exposed portions of substrate 110.

It will be understood from FIGS. 3 and 4 that additional structures, including a mask 104 and rail 310, may be used to support stencil element 420 in alignment with and against the substrate 110. However, these structures have been omitted from FIG. 7 for the sake of clarity.

Figure 8:
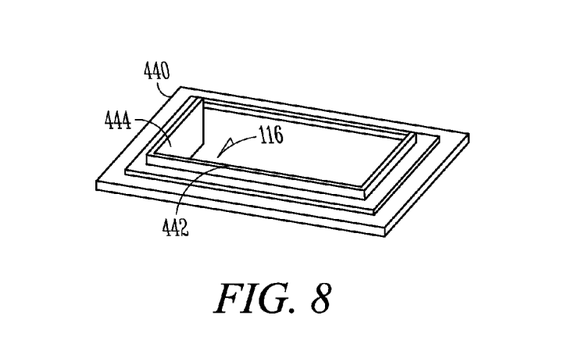
FIG. 8 illustrates a perspective representation of a stencil element having a rectangular wall with fewer than four segments, in accordance with another embodiment of the subject matter.

FIG. 8 illustrates a perspective representation of a stencil element 440 having a rectangular wall with fewer than four segments, in accordance with another embodiment of the subject matter. Stencil element 440, in the embodiment illustrated, may comprise a box-like interior portion 442, open at the top and bottom, and comprising a wall 444. Wall 444 may protrude from the bottom side of the stencil element 440.

In the example illustrated, wall 444 has at least one segment missing, because there is no wall segment visible on the back side.

Stencil element 440 has an aperture 116 to permit flux spray to contact die-bonding areas suitably aligned beneath it (not shown). One reason for using this particular type of stencil element 440 is for a fabrication condition wherein it doesn't matter if flux spray is applied in the region that is not masked by a wall segment, as shown in FIGS. 5 and 5A, or if it is desired to apply flux spray in such region.

The example shown is not intended to be limiting. Alternative geometries are possible, depending upon the desired pattern of flux spray.

The application of flux to an IC substrate using a flux spraying system having a compliant spray flux mask will now be described.

Figure 9:
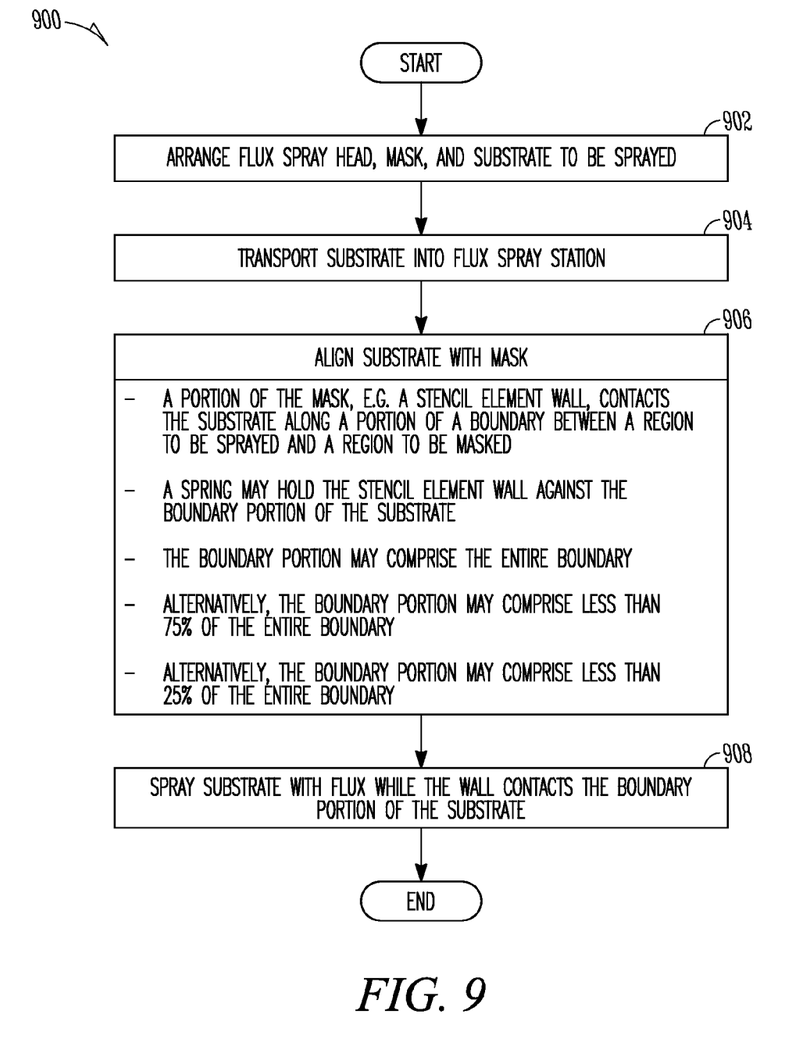
FIG. 9 is a flow diagram of several alternative methods of applying flux to a particular region of a substrate, in accordance with various embodiments of the subject matter.

FIG. 9 is a flow diagram 900 of several alternative methods of applying flux to a particular region of a substrate, in accordance with various embodiments of the subject matter.

In 902, a flux spray head, mask, and substrate to be sprayed are arranged or provided together. In an embodiment, a portion of the mask may contact the substrate along a portion of a boundary between a region to be sprayed and a region to be masked. In an embodiment, the mask may be affixed below the flux spray head, as in mask 104 in FIG. 1. In an embodiment, the mask may be aligned with the substrate prior to arranging the flux spray head. In an embodiment, the flux spray head and mask may be aligned with the substrate by a support element. In an embodiment, the mask may comprise a non-stick stencil element, as in stencil element 420 in FIG. 4.

In an embodiment, the stencil element may comprise a wall that protrudes from the stencil element along at least one side of the stencil element. In an embodiment, the stencil element may comprise a non-stick material from the group consisting of nylon, urethane, a thermoplastic elastomer, a thermoplastic polymer, a silicone elastomer, a coated metal, stainless steel, and glass. In another embodiment, the stencil element may comprise polytetrafluoroethylene, fluorinated ethylene-propylene, or perfluoroalkoxy polymer resin, or other suitable Teflon or non-stick material. In an embodiment, the mask may comprise a steel spring element to retain a stencil element and to press and hold the stencil element against the substrate, as in spring 430 in FIG. 4. In an embodiment, the substrate may be mounted on a carrier capable of holding multiple substrates, as in carrier 112 in FIG. 3. In another embodiment, the substrate may be arranged on any type of carrier capable of holding at least one substrate. In an alternative embodiment, the substrate may be arranged without using a carrier.

In 904, the substrate is transported into a flux spray station. In an embodiment, the substrate may be mounted on a carrier that may hold multiple substrates, as described above, and the carrier may be transported by a moving belt into the flux spraying system, as in belt 125 in FIGS. 1 and 2. In an alternative embodiment, the substrate may be transported into the flux spraying system by a different type of transport element or mechanism, such as a robotic arm, or other suitable automated mechanism. In an embodiment, the substrate may be transported into the flux spraying system by hand, where it may be positioned and arranged manually by a human operator.

In 906, the substrate is aligned with the mask. A portion of the mask, e.g. a stencil element wall, may contact the substrate along a portion of a boundary between a region to be sprayed and a region to be masked. In an embodiment, a spring may press the stencil element wall against the boundary portion of the substrate. The boundary portion may comprise the entire boundary. Alternatively, the boundary portion may comprise less than 75% of the entire boundary. Alternatively, the boundary portion may comprise less than 25% of the entire boundary. In an embodiment, the boundary portion may comprise the boundary, referring to the boundary in its entirety. In another embodiment, the boundary portion may comprise more than 50% of the boundary. In another embodiment, the boundary portion may comprise more than 80% of the boundary. In an embodiment, the region to be sprayed with flux comprises one or more die-bonding areas that may contain solder bumps, as within boundary 245 in FIG. 7.

In 908, the substrate is sprayed with flux while the wall of the mask contacts the boundary portion of the substrate. In an embodiment, the wall of the mask is pressed against the boundary portion of the substrate by a spring, as in spring 430 in FIG. 4.

The operations described above with respect to the methods illustrated in FIG. 9 may be performed in a different order from those described herein. Although the flow diagram of FIG. 9 shows an "End", it may be performed continuously if desired.

FIGS. 1-8 are merely representational and are not drawn to scale. Certain proportions thereof may be exaggerated, while others may be minimized. FIGS. 1-9 are intended to illustrate various embodiments of the subject matter that can be understood and appropriately carried out by those of ordinary skill in the art.

The inventive subject matter provides for masks, for apparatus, for systems, and for methods of manufacture that may minimize flux overspray problems associated with assembling high-performance electronic packages.

Other embodiments will be readily apparent to those of ordinary skill in the art after reading this disclosure.

While certain operations have been described herein relative to "upper" and "lower" surfaces, it will be understood that these descriptors are relative, and that they would be reversed if the spraying system were inverted. Therefore, these terms are not intended to be limiting.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the subject matter. Therefore, it is manifestly intended that embodiments of the subject matter be limited only by the claims and the equivalents thereof.

It is emphasized that the Abstract is provided to comply with 37 C.F.R. §1.72(b) requiring an Abstract that will allow the reader to ascertain the nature and gist of the technical disclosure. It is submitted with the understanding that it will not be used to interpret or limit the scope or meaning of the claims.

In the foregoing Detailed Description, various features are occasionally grouped together in a single embodiment for the purpose of streamlining the disclosure. This method of disclosure is not to be interpreted as reflecting an intention that the claimed embodiments of the subject matter require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

What is claimed is:
1. An apparatus comprising:
a flux sprayer to spray a substrate, the substrate having a region to be sprayed and a region to be masked, the two regions being separated by a boundary, the flux sprayer to spray the substrate over the entire region to be sprayed; and
a mask between the flux sprayer and the substrate, the mask comprising an aperture, the mask further comprising a wall forming the aperture and protruding away from a first surface of the mask towards the substrate to contact the substrate along the entire boundary, the mask to permit flux to be sprayed through the aperture over the entire region to be sprayed up to the wall and to prevent flux spray from extending beyond the wall into the region to be masked, the mask further comprising a drain to allow excess flux spray on a second surface of the mask to drain.

2. The apparatus recited in claim 1, wherein the mask is to be held against the substrate by a spring element.

3. The apparatus recited in claim 2, wherein the spring element is to press a stencil element against the substrate.

4. The apparatus recited in claim 1, wherein the substrate comprises a plurality of die-bonding areas, and wherein the boundary surrounds the entire plurality of die-bonding areas.

5. The apparatus recited in claim 1, wherein the substrate comprises a plurality of die-bonding areas, and wherein the boundary surrounds individual pairs of the plurality of die-bonding areas.

6. The apparatus recited in claim 1, wherein the mask comprises a stencil element having the aperture, and wherein the wall protrudes along an edge of the aperture.

7. A flux spraying system comprising:
    a spray station to contain a substrate to be sprayed, the substrate having a region to be sprayed and a region to be masked, the two regions being separated by a boundary, and including
        a spray head;
        a mask between the spray head and the substrate, the mask comprising an aperture, the mask further comprising a wall forming the aperture and protruding away from a surface of the mask towards the substrate to contact the substrate along the entire boundary, the mask to permit flux to be sprayed through the aperture over the entire region to be sprayed up to the wall and to prevent flux spray from extending beyond the wall into the region to be masked; and
        a support element including
            a frame, wherein the mask is affixed to the frame; and
            a lifter to lift a carrier supporting the substrate towards the mask to align the aperture in the mask with the region to be sprayed.

8. The system recited in claim 7 and further comprising a transport element to transport the carrier into the spray station.

9. The system recited in claim 7, wherein the frame comprises a rail to which the mask is affixed.

10. The system recited in claim 7, wherein the substrate comprises a plurality of rectangular die-bonding areas, wherein the mask comprises a plurality of rectangular stencil elements to be aligned with selected ones of the die-bonding areas, wherein at least one stencil element has an aperture to be aligned with two die-bonding areas, and wherein the wall protrudes from the aperture of the at least one stencil element to contact the substrate along the entire boundary that surrounds only the two die-bonding areas.

11. The system recited in claim 10, wherein selected stencil elements comprise a non-stick material from the group consisting of nylon, urethane, a thermoplastic elastomer, a thermoplastic polymer, a silicone elastomer, a coated metal, stainless steel, and glass.

12. The system recited in claim 10, wherein selected stencil elements comprise material from the group consisting of polytetrafluoroethylene, fluorinated ethylene-propylene, and perfluoroalkoxy polymer resin.

13. The system recited in claim 7, wherein the wall is to be pressed against the substrate by a spring.

14. The system recited in claim 7, wherein the substrate comprises a plurality of die-bonding areas, and wherein the boundary surrounds the entire plurality of die-bonding areas.

15. The system recited in claim 7, wherein the substrate comprises a plurality of die-bonding areas, and wherein the boundary surrounds individual pairs of the plurality of die-bonding areas.

16. The system recited in claim 7, wherein the substrate comprises a plurality of die-bonding areas, wherein the boundary surrounds individual die-bonding areas of the substrate.

17. An apparatus comprising:
    a flux sprayer to spray a substrate, the substrate having a region to be sprayed and a region to be masked, the two regions being separated by a boundary, the flux sprayer to spray the substrate over the entire region to be sprayed; and
    a mask between the flux sprayer and the substrate, wherein the mask comprises a stencil element, the stencil element comprising an aperture, the stencil element further comprising a wall forming the aperture and protruding from the stencil element towards the substrate, and wherein the wall is to contact the substrate along the entire boundary during spraying, the mask to permit flux to be sprayed through the aperture over the entire region to be sprayed up to the wall and to prevent flux spray from extending beyond the wall into the region to be masked, the mask further comprising a drain to allow excess flux spray on a surface of the mask to drain.

18. The apparatus recited in claim 17, wherein the substrate comprises a plurality of die-bonding areas arranged in pairs, wherein the boundary surrounds individual pairs of die-bonding areas, wherein the mask comprises a plurality of stencil elements each having an aperture, and wherein a wall protrudes along an edge of each aperture to contact the substrate along the entire boundary surrounding a pair of die-bonding areas.

19. The apparatus recited in claim 17, wherein the substrate comprises a plurality of die-bonding areas, and wherein the boundary surrounds the entire plurality of die-bonding areas.

20. The apparatus recited in claim 17, wherein the substrate comprises a plurality of die-bonding areas, and wherein the boundary surrounds individual pairs of the plurality of die-bonding areas.

21. The apparatus recited in claim 17, wherein the substrate comprises a plurality of die-bonding areas, wherein the boundary surrounds individual die-bonding areas of the substrate.

22. The apparatus recited in claim 17, wherein the stencil element is to be held against the substrate by a spring element.

* * * * *